US006777747B2

(12) United States Patent
Yedinak et al.

(10) Patent No.: US 6,777,747 B2
(45) Date of Patent: Aug. 17, 2004

(54) THICK BUFFER REGION DESIGN TO IMPROVE IGBT SELF-CLAMPED INDUCTIVE SWITCHING (SCIS) ENERGY DENSITY AND DEVICE MANUFACTURABILITY

(75) Inventors: Joseph A. Yedinak, Mountaintop, PA (US); Jack E. Wojslawowicz, Bayonne, NJ (US); Bernard J. Czeck, Mocanaqua, PA (US); Robert D. Baran, Plains, PA (US); Douglas Lange, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/050,976

(22) Filed: Jan. 18, 2002

(65) Prior Publication Data

US 2003/0136974 A1 Jul. 24, 2003

(51) Int. Cl.[7] .................... H01L 29/76; H01L 29/94; H01L 31/062
(52) U.S. Cl. .................... 257/339; 257/341; 257/342
(58) Field of Search .................... 257/330, 331, 257/341, 342, 132, 133, 139, 140, 146, 147, 155, 339

(56) References Cited

U.S. PATENT DOCUMENTS 5,528,058 A * 6/1996 Pike, Jr. et al. ............. 257/339

FOREIGN PATENT DOCUMENTS

JP 5-3324 * 1/1993 ............. 257/341

OTHER PUBLICATIONS

"Semiconductor devices, physcis and technology" by Sze, 1985, p. 38.*

* cited by examiner

Primary Examiner—Steven Loke
(74) Attorney, Agent, or Firm—Thomas R. FitzGerald, Esq.

(57) ABSTRACT

An IGBT has a thick buffer region with increased doping to improve self-clamped inductive switching and device manufacture. A planar or trench gate IGBT has a buffer layer more than 25 microns thick. The buffer layer is doped high enough so that its carriers are more numerous than minority carriers, particularly at the transition between the N buffer & N drift region.

10 Claims, 5 Drawing Sheets

THICK BUFFER REGION DESIGN TO IMPROVE IGBT SELF-CLAMPED INDUCTIVE SWITCHING (SCIS) ENERGY DENSITY AND DEVICE MANUFACTURABILITY

BACKGROUND

Insulated gate bipolar transistors (IGBTs) are popular control devices for automobile ignition systems. The IGBT can carry large currents with very low resistance and can be rapidly switched on and off with a low voltage gate. They combine the control characteristics of DMOS devices with the current carrying capacity of thyristor.

A typical IGBT is shown in FIG. 3a. Those skilled in the art understand that IGBTs are formed in cellular arrays of sources and bases with emitters. As shown in FIG. 3a, the IGBT 10 has an epitaxial layer 11 that includes N+ source regions 2 surrounded by P-typed base regions 3. A lightly doped N drift region 5 overlies a heavily doped N buffer region 7. The epitaxial layer 11 is formed on top of a heavily P doped substrate 9. On top of the device, a gate insulating layer 17, typically of silicon dioxide, covers the top of the epitaxial layer 11. A gate conductive layer, typically polysilicon 19, covers the insulating layer 17 and forms a gate electrode. Another insulating layer 21 covers the polysilicon and a metal contact layer 23 contacts the source 2 and the base 3 of each cell. The above description is for a planar device with the gate on the surface. However, the IGBT may be fabricated with a trench gate. See FIG. 3b.

IGBTs may be used in ignition control circuits such as those showed in FIGS. 1 and 2. Those circuits are discussed in this Background portion of the specification in order to explain the invention. The location of that discussion and the discussion itself are not admissions that the circuits are prior art. When the IGBT 10 is on, it drops a low voltage VCE(sat) and current flows through the primary side 12 of transformer 14. The ratio of the primary to the secondary coil 16 is about 100:1. The voltage is allowed to build to about 400 volts across the primary. When the spark plug is triggered, most of the energy is discharged in the spark. If there is any residual energy, it is dissipated by an auxiliary clamp circuit. In FIG. 1 the clamp circuit 30a is a single pair or multiple pairs of Zener diodes 20, 22 with a cumulative breakdown voltage of about 400 volts. In FIG. 2 the clamp circuit 30b is a voltage divider including resistors R1, R2 and a single pair or multiple pairs Zener diodes 24. After the gate signal is removed, auxiliary circuits 30a and 30b keep the IGBT 10 on in order to dissipate residual energy and prevent a localized failure.

The voltage for the auxiliary circuits 30a and 30b is set by the zener diodes to dissipate the energy over time. A problem arises if there is no spark due to, for example, a broken spark plug wire or a fouled plug. That leaves an open secondary 16 and the energy remains stored in the inductors 12, 16. With the gate turned off, the energy stored in the primary 12 cannot be transferred to the secondary 16. The primary 16 forces the voltage to rise until the zeners break down. In the self clamped inductive switching (SCIS) mode a portion of the collector current, Izener, is diverted from the collector and into the gate to keep the IGBT on. Then energy stored in the primary inductor 12 will dissipate even after the gate signal is removed.

In the SCIS mode, the IGBT must be capable of absorbing all the energy stored in the ignition coil during abnormal operating conditions. The most common of these abnormal conditions is an open secondary. The N buffer layer 7 plays an important part in the enhancement of the SCIS energy density of IGBT. It is important to minimize the buffer sheet resistance or increase the integrated buffer charge to reduce the parasitic p-n-p current gain $\alpha_{p\text{-}n\text{-}p}$ transistor formed by P Base 3, N regions 5, 7 and the P collector 9. Reducing $\alpha_{p\text{-}n\text{-}p}$ increases the SCIS energy density. The previous generations of IGBT (see FIGS. 5, 6) had relatively thin N buffer regions. For such devices the thinner buffer layer reduced the cost of the starting wafer and, with older deep junction cell technologies, minimized the die size due to increased on-state voltage drop.

More recent devices use designs that have highly reduced on-state voltage drops by using a cellular structure that has shallow planar junctions or trench cellular technologies. Those designs allow the N buffer sheet resistance to be reduced while maintaining an equivalent on-state voltage drop. The newer designs reduce the buffer sheet resistance by: (1) increasing the net peak doping concentration of the buffer and, (2) keeping the buffer thickness the same as previous designs. However, thin buffer regions have several drawbacks. It is often difficult to control their integrated charge. Typical thin buffers are on the order of 12 microns or less. These layers are produced by epitaxial deposition and small errors in epitaxial growth of only a few microns can have dramatic unwanted consequences. Thin layers make it difficult to control the integrated buffer charge or buffer sheet resistance due to out diffusion of the P+ substrate during growth of the epitaxial layer 7 and during high temperature wafer fabrication processing. The migration of P-type dopants from the substrate into the buffer region reduces the desired charge profile of the buffer region.

Characteristics of a conventional design are shown in FIGS. 5 and 6. The SCIS capability is directly related to the IGBT parasitic p-n-p current gain $\alpha_{p\text{-}n\text{-}p}$. That is the gain of regions 3, 5/7 and 9. The $\alpha_{p\text{-}n\text{-}p}$ determines the level of electron current required to drift through the MOS channel to pass the current during the SCIS clamping phases. The amount of electron current determines how high a voltage level the IGBT gate must be driven to deliver the required the p-n-p base electron current. During SCIS the junction temperature of the IGBT P base increases, thus increasing the level of thermally generated electron leakage current. The leakage current is a another source of p-n-p base current that reduces the amount of electron current to be supplied through the gate controlled MOS channel. If the IGBT is stressed to a high level of SCIS energy, the temperature at the P base junction can reach a level where all the electron current can be supplied by the thermally generated leakage current. At that point the IGBT loses gate control, thermal runaway occurs, and the IGBT clamping function fails. This is further compounded by the fact that the buffer lifetime $\tau_p$ increases as the temperature in the buffer increases due to the thermal transfer of heat from the $J_{total} \cdot E$ product. As carrier lifetime increases, there is a corresponding increase in the p-n-p's emitter injection efficiency $\gamma_{p\text{-}n\text{-}p}$ which in turn increases the gain, $\alpha_{p\text{-}n\text{-}p}$. Increasing $\alpha_{p\text{-}n\text{-}p}$ results in a lower level of electron current required to drift through the MOS channel to pass the total device current ($I_{hole}+I_{electron}$). Thus, the device fails at a lower instantaneous peak junction temperature resulting in a lower SCIS energy density.

FIG. 5 shows the vertical doping, Efield, electron and hole carrier concentration, and the total current density($J_{total}$) profiles, including the horizontal location of the peak power dissipation during the clamping phase of SCIS for an 8.4 micron thick buffer with an integrated charge of 4.88E+13 a/cm² and buffer sheet resistance of 169 Ω/sq. It can be seen that p-n-p emitter injection efficiency $\gamma_{p\text{-}n\text{-}p}$ is high throughout the buffer and both the electron and hole injected carrier concentrations exceed the peak buffer doping concentration. FIG. 6 shows the SCIS waveform for a 310 mJ 14.2 A stress for the vertical doping profile of FIG. 5. The device clamp fails after about 95 $\mu$sec time in clamp and $\alpha_{p\text{-}n\text{-}p}$=2.52 at the start of SCIS clamping phase.

The silicon area of the IGBT is defined by its SCIS energy density capability. Therefore, it is highly desired that the SCIS energy density(mJ/cm$^2$) be increased in order to:

1. Shrink the silicon area to reduce cost.
2. Reduce the IGBT's footprint to free up module space. A 60% reduction in the footprint can be realized by offering the same SCIS capability in the DPak (TO-252) rather than a D2 Pak (TO-263). Supplying the same device performance in a DPak allows the module designer to add this functionality without increasing the module size.

SUMMARY

The invention provides an IGBT with improved SCIS energy dissipation. The IGBT is made on a semiconductor substrate with one or more epitaxial layers grown on the substrate. The substrate or collector is typically a heavily doped P-type substrate. A heavily doped N buffer is grown on the P+ substrate. An N drift layer with light doping is grown on top of the N buffer layer. The top epitaxial layer has an array of P-type isolated base regions and/or single base region and N+ emitter regions. The typical IGBT is an NPNP device, but the relative dopings can be reversed to provide a PNPN device. The invention provides an N Buffer layer that is thicker than 25 microns and a doping concentration that results in injected hole carrier concentration in the buffer region at the drift end to be less than the peak buffer doping concentration. The doping profile of the buffer can be between 8.0 E16 and 6 E17 atoms/cm$^3$. This structure reduces the gain of the intrinsic p-n-p transistor that comprises the P-base, the N−drift/N+buffer, and the P+ collector substrate. But the doping is sufficient to keep the forward voltage drop within acceptable limits and will support a reverse blocking voltage of at least 20 volts and preferably 24 volts.

The gain of the intrinsic p-n-p transistor comprising the base, the drift and buffer layer and the collector region is less than 1. The buffer region has a doping concentration greater than the doping concentration of the drift region. The concentration of the buffer region is substantially constant throughout the buffer region. The IGBT has a relatively shallow source with a depth not more than 0.4 microns and base whose depth is not more than 3 microns. That yields a device where the channel is not longer than about 1.5 microns. In the preferred embodiment the cell pitch is not more than 20 microns.

DETAILED DESCRIPTION OF THE INVENTION

The invention provides a structure for designing the vertical buffer region of the IGBT to enhance SCIS energy density and reduce SCIS energy density variability. The yield of devices made with the invention is increased because it allows wider tolerances for the buffer thickness and it reduces variability of buffer sheet resistance during epitaxial buffer growth and wafer processing due to out diffusion from the P+ substrate.

Figure 1:
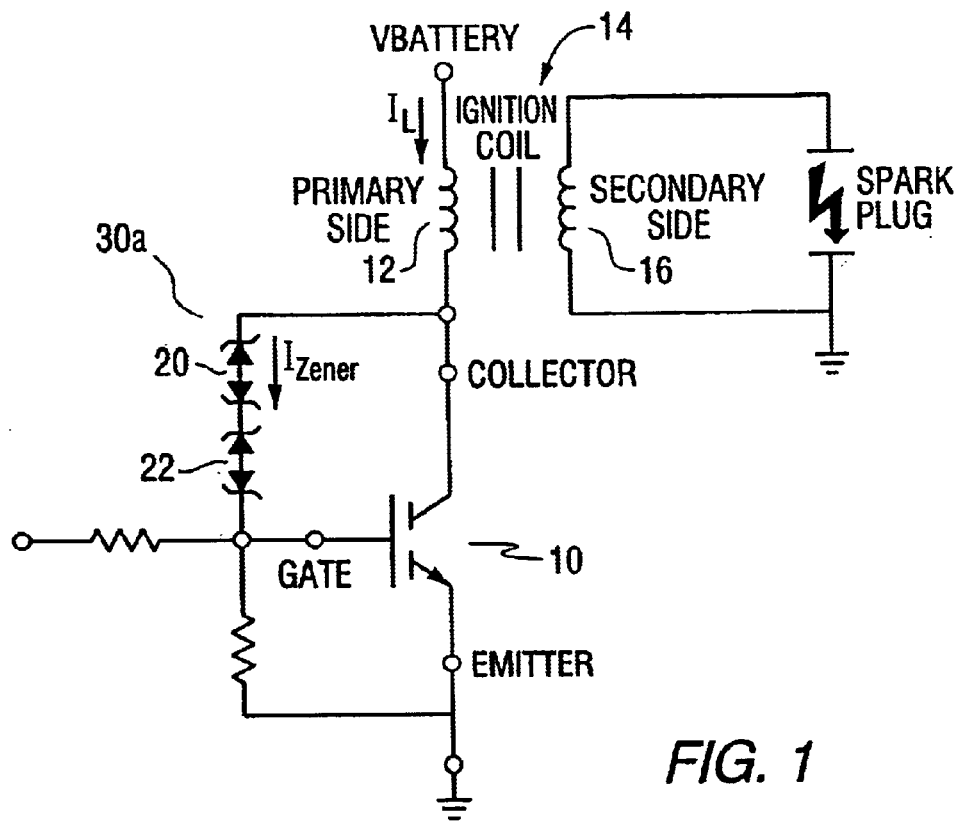
FIGS. 1 and 2 show ignition controls circuits with IGBTs.
Figure 2:
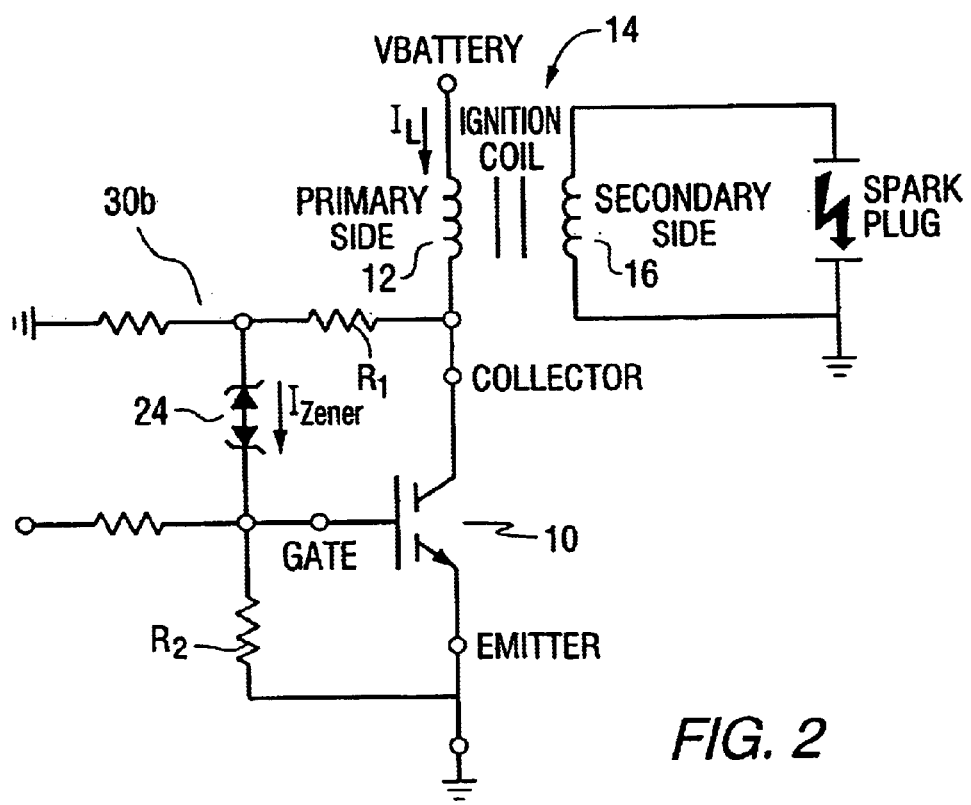
Figure 3A:
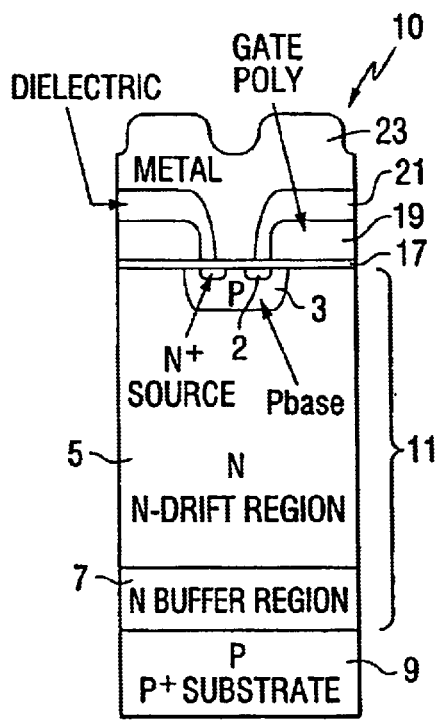
FIG. 3a is a cross sectional view a surface gate IGBT cell.
Figure 3B:
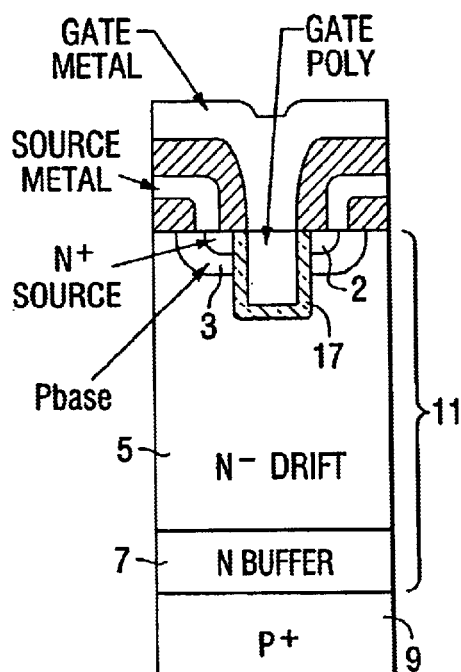
FIG. 3b is a trench-gate IGBT.
Figure 4:
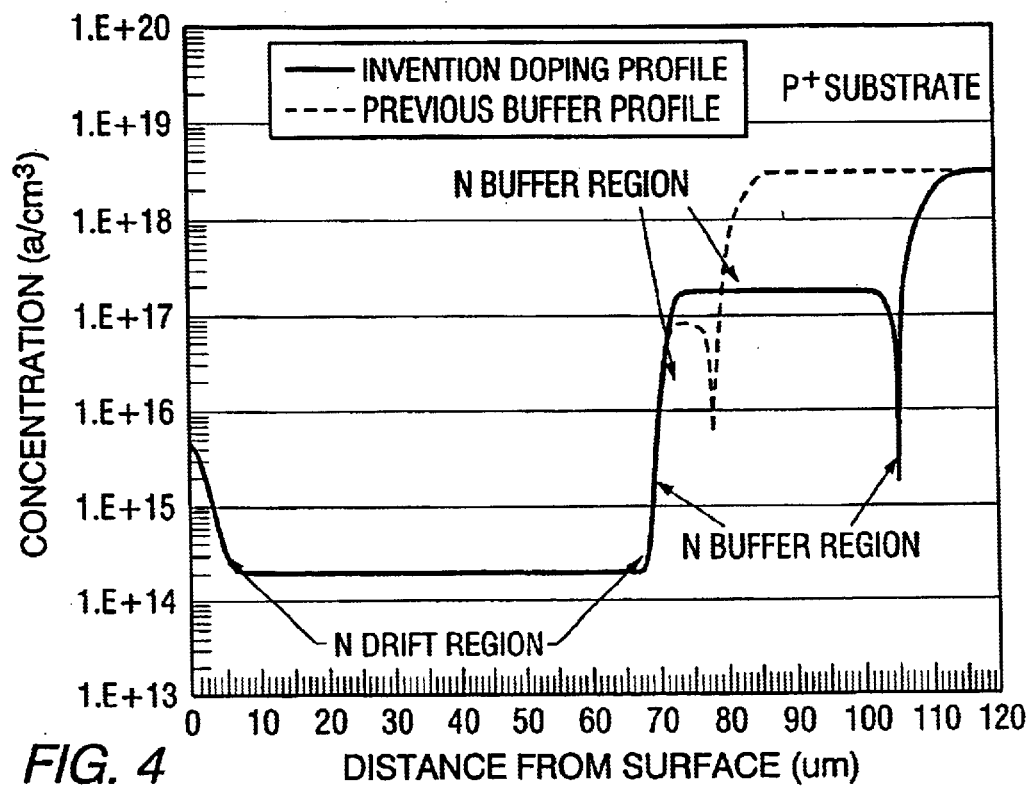
FIG. 4. is a comparison of the doping profile of a prior art device and a device made in accordance with the invention.
Figure 5:
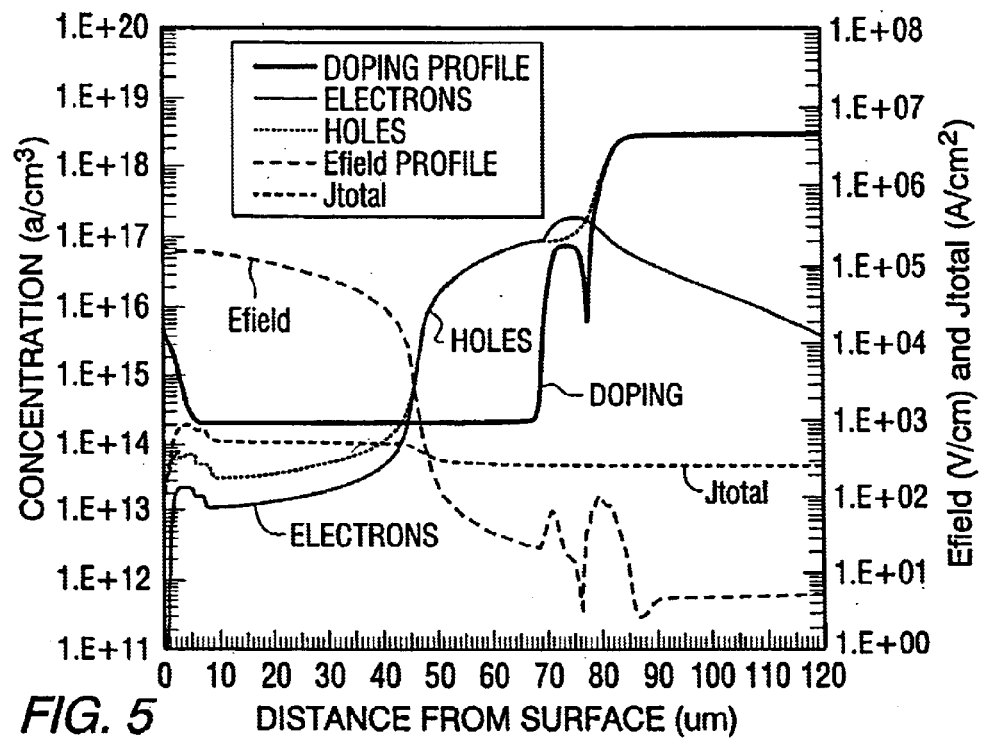
FIG. 5 shows concentration, Efield and Jtotal as function of distance for a conventional thin buffer IGBT.
Figure 6:
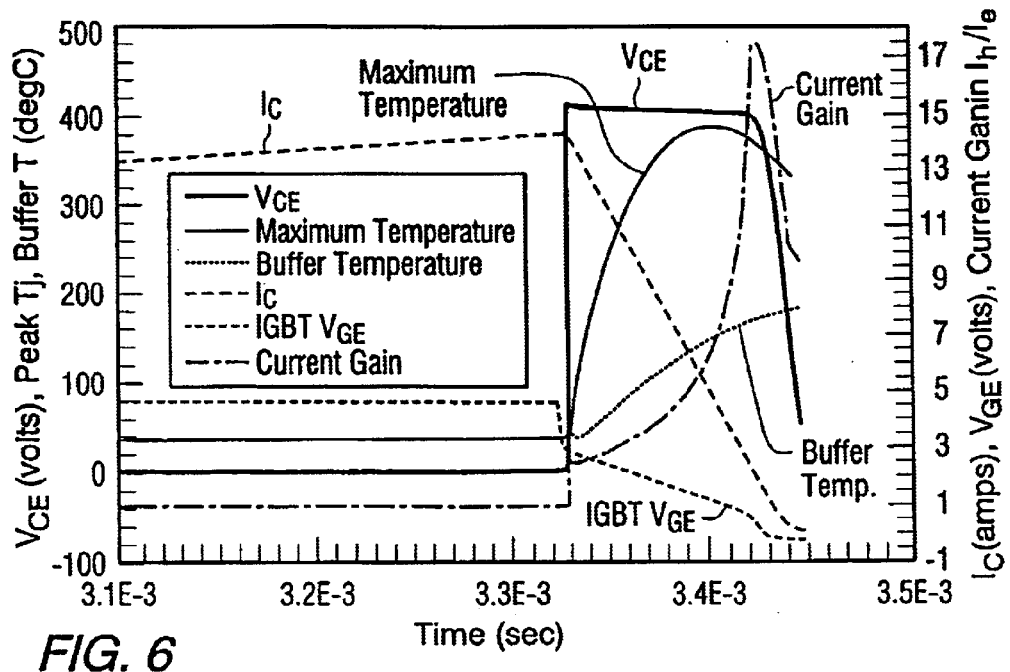
FIG. 6 is a timing diagram showing, on the first vertical axis, $V_{CE}$, Peak temperature at the base/emitter and temperature at the buffer and on the second vertical axis $I_C$, collector current, $V_{GE}$, and Current Gain $I_h/I_e$.
Figure 7:
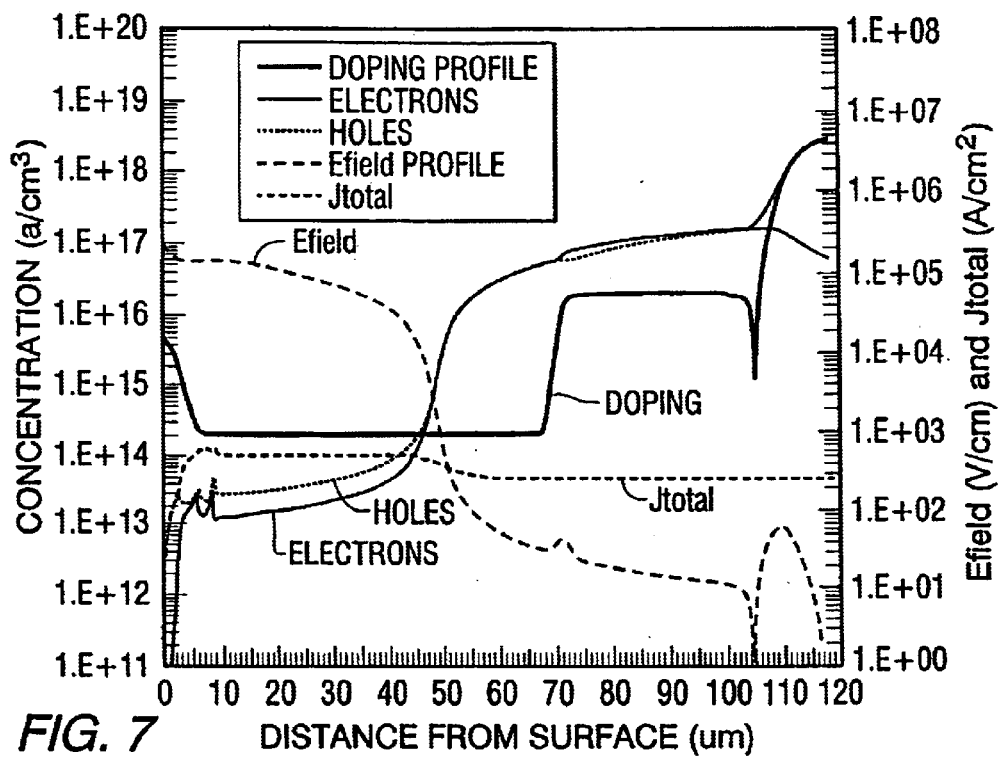
FIGS. 7 and 8 are similar to FIGS. 5 and 6 and shows the doping and performance of an IGBT with a thick buffer (34.8 $\mu$m), a buffer doping of about 2.0 E+16 a/cm$^3$ and buffer sheet resistance of 95 $\Omega$/sq.
Figure 8:
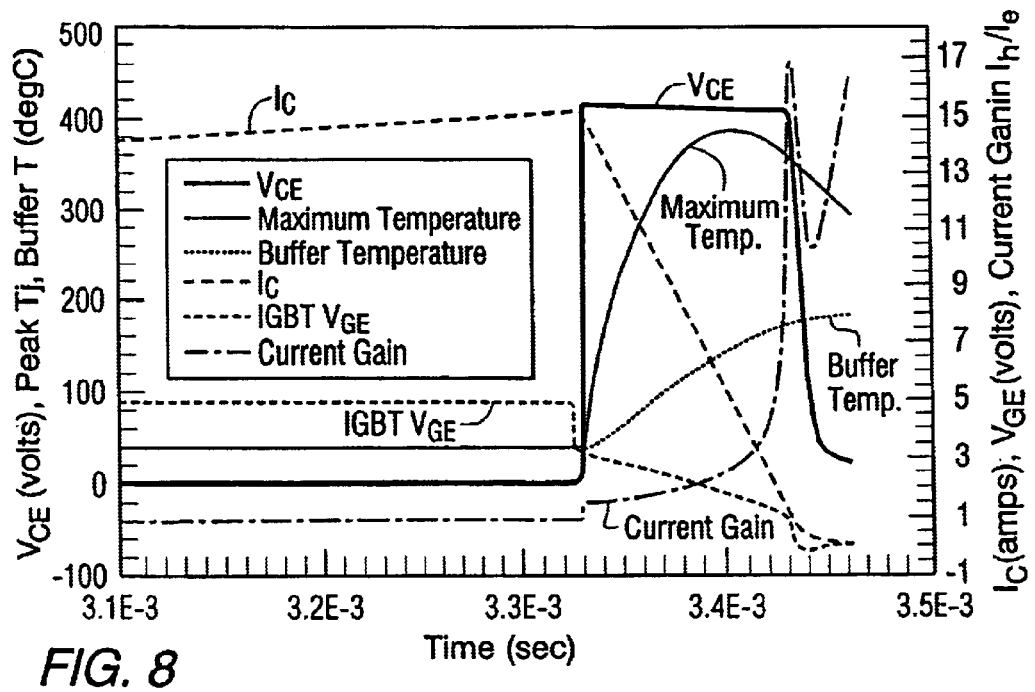

FIGS. 3a and 3b show typical surface and trench gate IGBTs and show the locations of N buffer regions. FIG. 4 overlays a prior art design (FIG. 5) with the new thicker buffer layer design (FIG. 9) that increases SCIS energy density. Each of the simulated examples showed in FIGS. 5–10 uses the same relative structure for the IGBT. The differences between the devices showed in FIGS. 5–7 and 9–10 are indicated below. FIG. 7 shows the same profiles as the device of FIG. 5, except the buffer for FIG. 7 is thicker (34.8 $\mu$m) which yields an integrated charge of 6.6E+13 a/cm$^2$ and buffer sheet resistance of 95 $\Omega$/sq. FIG. 8 shows the SCIS waveforms for this buffer subjected to the same SCIS stress as that in FIG. 6. The device clamp fails after about 100 $\mu$sec time in clamp and $\alpha_{p\text{-}n\text{-}p}$=1.39 at the start of SCIS clamping phase.

Figure 9:
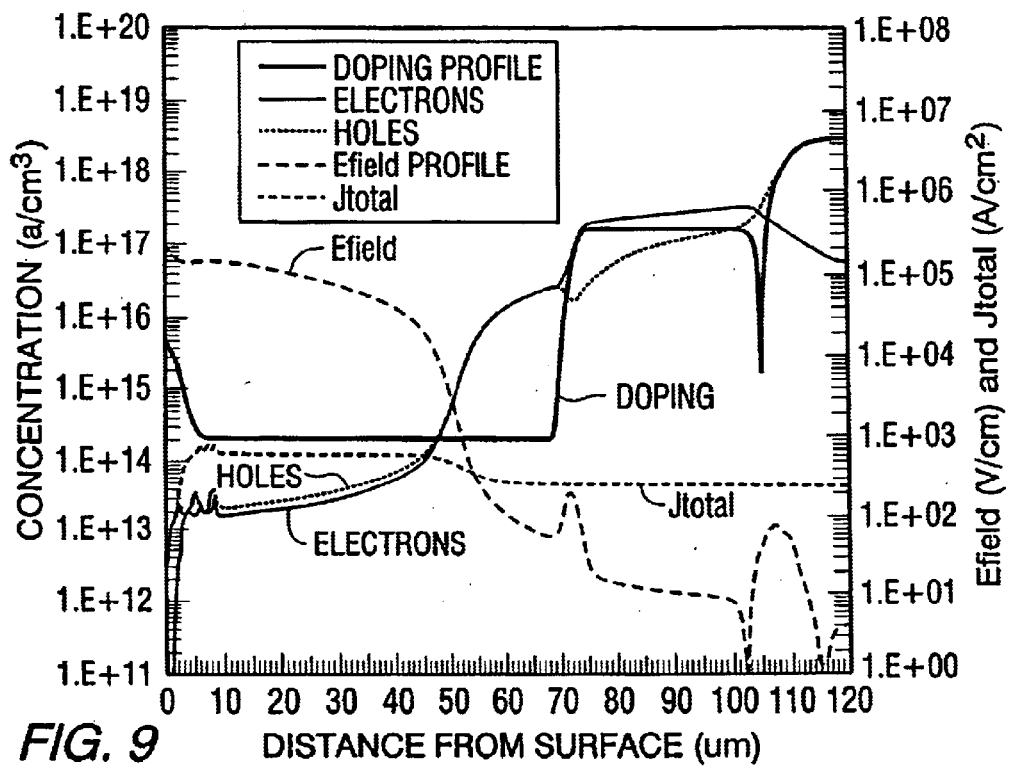
FIGS. 9 and 10 are similar to FIGS. 5 and 6 and show the concentration and timing performance of an IGBT with a buffer of 35 microns and a buffer doping of 1.74 E+17 a/cm$^3$
Figure 10:
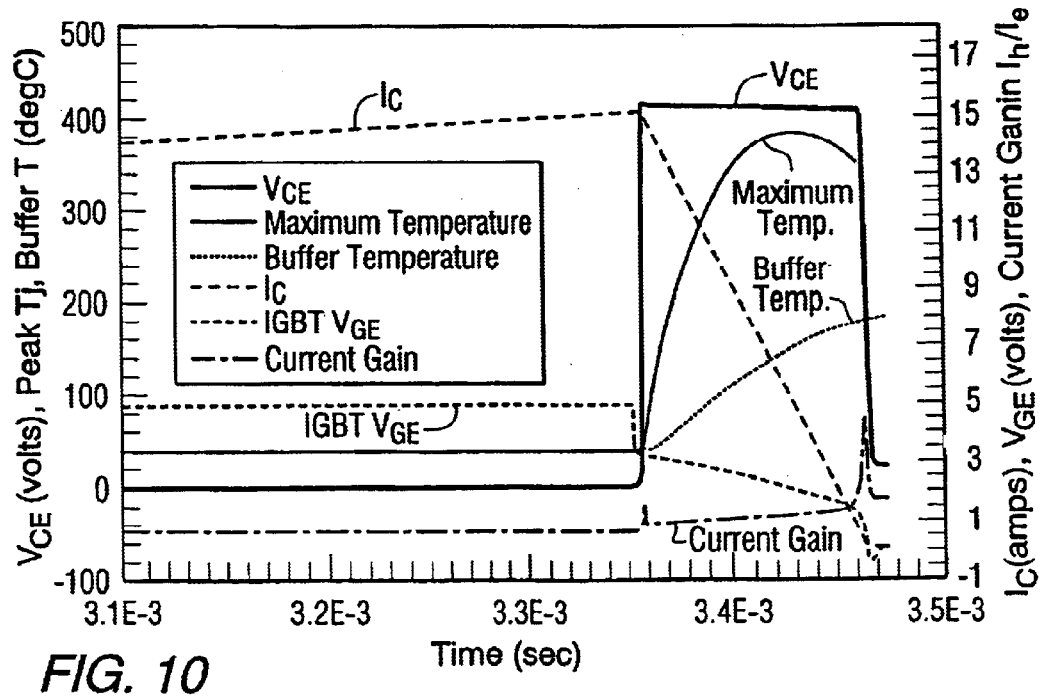

In the invention the N buffer layer thickness is increased to more than 25 um and the peak doping concentration is controlled such that the injected hole carrier concentration at the drift region end of the buffer is less than the peak buffer doping concentration and/or $\alpha_{p\text{-}n\text{-}p}$<1.0 when the IGBT is under peak SCIS power dissipation. Peak power dissipation occurs when the IGBT is at the clamping voltage and peak SCIS current. The invention helps reduce device cost by shrinking die active area required to maintain the clamping function for the specified SCIS energy. The invention also provides a method of designing IGBTs with more than 40 volts reverse blocking capability (BVECO, BVECS, or BVECR) while maintaining a high SCIS energy density. Turning to FIG. 9, there is shown the doping of an IGBT made in accordance with the invention. The doping is taken along a line adjacent the P base through the N JFETregion, N drift, N buffer and P+ substrate. The buffer region begins at about 70 microns and ends at about 105 microns. The number of electrons in the buffer region exceeds the number of holes and the 1.74 E+17 a/cm$^3$ doping concentration. The increased doping concentration of the buffer yields a relatively low sheet resistance of approximately 10 to approximately 60 ohms/sq. A simulated test was run at 270C, 14.2 amps, Vge=5 volts, Rge=1k and a gain of pnp<1.0. At about time 3.35E−3 seconds, the gate signal is turned off and the coil is left open. The voltage VCE rapidly rises from zero to about 400 volts. The junction temperature and the buffer temperature rise as expected and the VGE falls. Note that the current gain has a spike but remains less than one until the collector current is almost zero.

Corresponding simulated tests were made on conventional devices and on a device modified with a thicker buffer but with no change in doping levels. The results for the conventional device are shown in FIGS. 5 and 6. The buffer begins at about 70 microns and ends at about 80 microns. FIG. 6 shows that after the gate is turned off at about 3.33E−3 seconds, the current gain rapidly increases which results in device failure. FIGS. 7 and 8 show that a thicker buffer alone is not sufficient to reduce current gain. There the buffer layer was about 35 microns thick but the doping in the buffer layer was about the same as in the conventional device, 1.74E+16 atoms/cm$^3$. The current gain increases and the device will fail.

The sample embodiment and the prior art are compared to each other in FIG. 4 and the following table.

|  | Prior Art | Invention |
| --- | --- | --- |
| Source | 0.5 microns | 0.3 microns |
| Base | 5.5 microns | 2.5 microns |
| channel length | 4.5 microns | 1.4 microns |
| buffer thickness | 10 microns | 35 microns |
| buffer doping | not more than 1.5E+17 atom/cm$^3$ | 8.0E+16 to 6.0E+17 atoms/cm$^3$ |
| cell spacing | 28 microns | 19 microns |

The design of the invention strikes a balance between die size and performance. The N Buffer controls the reverse breakdown voltage. In an IGBT for automobile ignitions, the reverse breakdown voltage is more than 20 volts and preferably 24 volts. The buffer provides a certain amount of charge that is determined by the buffer's thickness and the doping. In deep junction prior art devices, if you made the old buffer thicker, the on-state voltage would be higher. The goal is to have the smallest size die that can handle the largest expected current and SCIS energy. Thick buffers tend to increase the on state voltage drop. In prior art devices, control of the thickness of the buffer layer to within one or two microns was critical. By having a shallower base and source, you gain freedom in setting the thickness of the buffer. With the invention, designers and manufacturers have greater latitude in growing the epitaxial buffer layer.

IGBTs fail because their temperature exceeds a maximum allowable level set by the design. The electron current goes through the channel that forms in the P base and resistively connects the drift region to the N+ source. With shallower junction and tighter cell pitched devices the channel density can be increased. This reduces the channel current density lower than the older, deep junction devices. Peak temperature is at the surface. Heat generates leakage current that is mostly electron current. The heat-generated leakage current goes into the base of the parasitic p-n-p formed by regions 3, 5/7, and 9. As the device heats up, the gate bias required decreases because the original gain of 0.5 increases due to buffer heating and the collector current decays. At high enough temperatures the heat will generate enough leakage current to keep device on, the device loses gate control and the clamp fails. Modern shallow junction devices lower the temperature by reducing the cell pitch, decreasing the channel current density and more uniformly distributing the current flow throughout the IGBT.

The results of the simulations showed in FIGS. 6–10 indicate that the prior art device made in accordance with FIG. 5 and the thick buffer with lighter doping of FIG. 7, would fail under operating conditions. Consider FIG. 6. The gate voltage IGBT Vge falls to zero as the device switches. However, the collector current Ic continues and the end of the switching period, the voltage Vce is more than zero. Those observations lead to the conclusion that the gate has lost control of the device and that a device constructed in accordance with the simulated example of FIG. 6 would fail. FIG. 8 shows data that leads to a similar conclusion. There is substantial current Ice even after the gate voltage IGBT Vge is zero and the voltage across the device, Vce, turns up at the end of the switching cycle. FIGS. 6 and 8 also shows that the current gain at the ends of the switching cycle is 10 or more. That is another indication of an uncontrolled device.

In contrast, a device made in accordance with FIG. 9 would survive. There the voltage across the gate falls to zero at about the same time as the current through the device, Ic, is zero. The voltage across the device at the end of the switching cycle is also zero. Both observations lead to the conclusion that the gate retains control during the switching cycle and a device constructed in accordance with FIG. 9 would operate throughout the cycle. The current gain remains about 1 at the end of the cycle, indicating a device under gate control.

The invention further improves the SCIS capability of the device by increasing the electron current to hole current ratio ($I_e:I_h$). The invention reduces the gain of the p-n-p by reducing its injection efficiency by increasing the integrated charge in the buffer. By making the buffer layer thicker and more heavily doped, the overall gain is reduced when compared to the p-n-p structures of prior art devices. As a result, IGBTs with the invention can withstand higher temperatures before they lose gate control.

The thickness and the doping of the buffer layer define the total charge in the buffer layer. In addition, buffer doping controls reverse breakdown. Increasing doping reduces gain and the invention provides enough charge in the buffer layer to reduce the p-n-p gain. By putting more charge into the buffer region than in prior art devices, the invention reduces the efficiency of the emitter of the p-n-p transistor and thereby reduces its gain. Buffer doping controls reverse breakdown. The highest allowable buffer doping concentration is set as a function of reverse breakdown voltage. If you go too light in doping, the buffer gets too thick resulting in high cost. Conduction gain is low for the invention because very little of the N base of the p-n-p is not depleted of carriers. The devices whose characteristics are shown in FIGS. 5, 7, and 9 all have low gains during normal conduction when there is very little depletion. But during SCIS a large portion of their drift regions are depleted. See FIGS. 5 and 6 including the electric field (E field) that crosses the doping profile at about ⅔ of the total distance of the N drift and N buffer. The base width of the p-n-p is smaller, only about ⅓ of the drift and the buffer region. Thin buffers heat up quickly and their gain increases with temperature. Comparing FIG. 7 to FIG. 5, the buffer is much thicker, but the doping is reduced. The gain is about the same indicating the thickness and doping are inversely proportional. When FIG. 7 is compared to the exemplary embodiment in FIG. 9, one sees that the doping in FIG. 9 is higher, the thickness of the buffers are the same and the gains are quite different. The gain in FIG. 9 remains less than 1 through most of the trial and does not exceed 10. The gain changes very little with increases in temperature because the buffer is so thick and the doping is so high.

What is claimed is:

1. An IGBT with improved Self-Clamped Inductive Switching (SCIS) energy dissipation, comprising:
   a semiconductor substrate having first and second surfaces spaced from each other;
   a source region in the first surface, the source region heavily doped with a dopant of a first polarity;

a base region in the first surface, the base region surrounding the source region and doped with a dopant of a second, opposite polarity;

a drift region of the same polarity doping as the source region, the drift region extending from a first end at the first surface to a second end spaced from the first surface in a direction toward the second surface;

a buffer region disposed adjacent the second end of the drift region and having the same polarity as the source region; and a collector region in the second surface and heavily doped with a dopant of the second polarity, wherein the buffer region doping concentration has a peak doping concentration at a location proximate the drift region greater than injected hole carrier concentration in the buffer region at the drift end of the buffer region.

2. The IGET of claim 1 wherein the parasitic current gain of the transistor comprising the base, the drift and buffer regions and the collector region is less than 1 at the beginning of self clamping phase of SCIS.

3. The IGBT of claim 1 wherein the buffer region has a doping concentration greater than the doping concentration of the drift region.

4. The IGBT of claim 1 wherein the buffer region doping concentration is substantially constant throughout the buffer region.

5. The IGBT of claim 1 wherein the peak SCIS power dissipation occurs at clamping voltage and peak SCIS current.

6. The IGBT of claim 1 wherein the buffer region is equal to or greater than 25 microns.

7. The IGBT of claim 1 wherein the peak doping of the buffer region is between 8.0E+16 and 6.0E+17 atoms/cm$^3$.

8. The IGBT of claim 1 wherein the sheet resistance of the buffer region is between 10 and 60 ohms/sq.

9. An IGBT with improved Self-Clamped Inductive Switching (SCIS) energy dissipation, comprising:

a semiconductor substrate having first and second surfaces spaced from each other;

a source region in the first surface, the source region heavily doped with a dopant of a first polarity;

a base region in the first surface, the base region surrounding the source region and doped with a dopant of a second, opposite polarity;

a drift region of the same polarity doping as the source region, the drift region extending from a first end at the first surface to a second end spaced from the first surface in a direction toward the second surface;

a buffer region disposed adjacent the second end of the drift region and having the same polarity as the source region; and a collector region in the second surface and heavily doped with a dopant of the second polarity, wherein the buffer region is thick enough to and has a sufficient doping concentration to lower injected hole carrier concentration in the buffer region at the drift end of the buffer region to a level less than the peak buffer doping concentration when the IGBT Is under peak SCIS power dissipation.

10. A method for improving the Self-Clamped Inductive Switching (SCIS) energy dissipation of an Insulated Gate Bipolar Transistor (IGBT), the IGBT having a substrate with first and second surfaces spaced apart from each other, a base region disposed in said first surface and surrounding a source region that is doped with a dopant of a first polarity, said base region being doped with a dopant of a second polarity opposite said first polarity, a drift region doped with dopants of the same polarity as said source region, and a collector region disposed in said second surface being heavily doped with a dopant of the second polarity type, said method comprising:

providing a buffer layer intermediate the drift region and the collector region, the buffer layer having a thickness and a concentration of dopants of the first polarity type that conjunctively act to maintain a peak concentration of dopants of the first polarity type greater than a concentration of injected carriers of the second polarity type in a region of the buffer layer that is proximate the drift region.

* * * * *